(12) United States Patent
Kato et al.

(10) Patent No.: US 6,697,414 B1
(45) Date of Patent: Feb. 24, 2004

(54) LIGHT EMITTING APPARATUS

(75) Inventors: Takashi Kato, Yokohama (JP); Keiko Matsumoto, Yokohama (JP)

(73) Assignee: Sumitomo Electric Industries, Ltd., Osaka (JP)

(*) Notice: Subject to any disclaimer, the term of this patent is extended or adjusted under 35 U.S.C. 154(b) by 157 days.

(21) Appl. No.: 09/665,107

(22) Filed: Sep. 20, 2000

(30) Foreign Application Priority Data

Sep. 20, 1999 (JP) ............................... P11-265429

(51) Int. Cl.$^7$ ................................ H01S 3/08
(52) U.S. Cl. .................... 372/703; 372/102; 385/88; 385/37
(58) Field of Search ................ 372/703, 102, 372/6; 385/88, 37

(56) References Cited

U.S. PATENT DOCUMENTS

| | | | |
|---|---|---|---|
| 4,712,880 A | * 12/1987 | Shirasaki | 359/281 |
| 5,612,968 A | * 3/1997 | Zah | 372/20 |
| 5,699,377 A | * 12/1997 | Pan | 372/92 |
| 5,993,073 A | * 11/1999 | Hamakawa et al. | 385/88 |
| 6,048,103 A | * 4/2000 | Furukata et al. | 385/73 |
| 6,244,754 B1 | * 6/2001 | Takagi et al. | 372/20 |
| 6,273,620 B1 | * 8/2001 | Kato et al. | 385/88 |
| 6,320,888 B1 | * 11/2001 | Tanaka et al. | 372/102 |

FOREIGN PATENT DOCUMENTS

| | | |
|---|---|---|
| JP | 10-290050 | 10/1998 |
| JP | 11-177178 A | 7/1999 |

OTHER PUBLICATIONS

F. N. Timofeev et al. "Dense WDM Transmission in Standard Fibre Using Directly–Modulated Fibre Grating Lasers at 2.6 GBIT/S" ECOC 97, Sep. 22–25, 1997, Conference Publication No. 448, pp. 1–4.

Takashi Kato et al. "Semiconductors Laser with Fiber Grating" *Technical Report of the Institute of Electronics, Information and Communication Engineers*, (Jul. 1999) pp. 37–40.

* cited by examiner

Primary Examiner—Jerome Jackson
Assistant Examiner—Matthew C. Landau
(74) Attorney, Agent, or Firm—Smith, Gambrell & Russell, LLP

(57) ABSTRACT

A light emitting apparatus has a light generating portion, an output, and an optical isolator. The light generating portion includes a semiconductor optical amplifier and a grating fiber. The semiconductor optical amplifier has a light emitting surface and a light reflecting surface, and the grating fiber has a first end optically coupled to the light emitting surface, and a grating provided in its core part. The output is designed to provide light generated in the light generating portion. An optical isolator is placed between the light generating portion and the output. In the light emitting apparatus, the isolation of the optical isolator is specified to be not less than $-52.4-8.7 \times \log(BER)$ in dB with respect to a bit error rate BER to be achieved at the transmission rate of 2.5 Gbps in the 1.55-$\mu$m band.

20 Claims, 9 Drawing Sheets

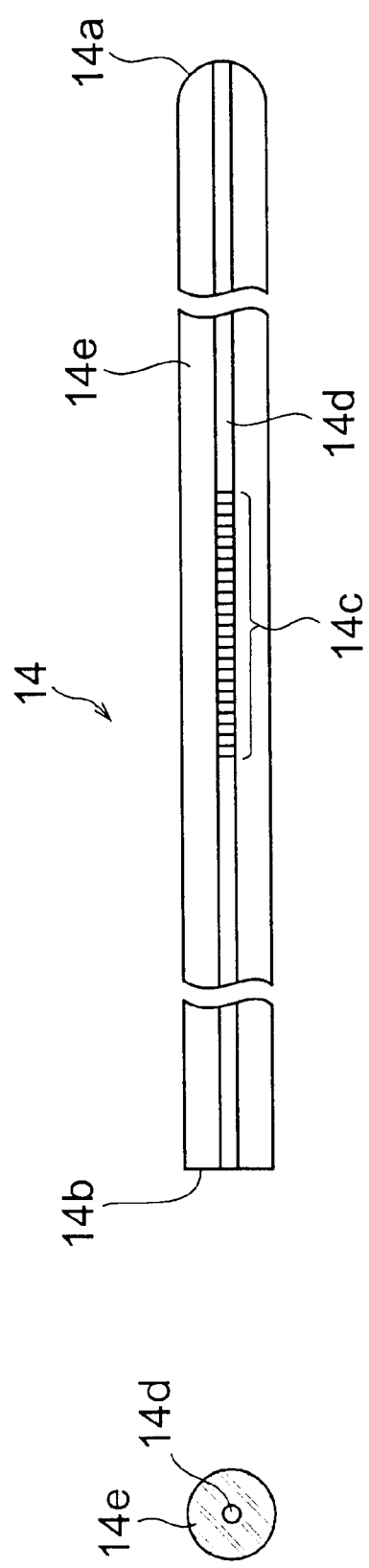

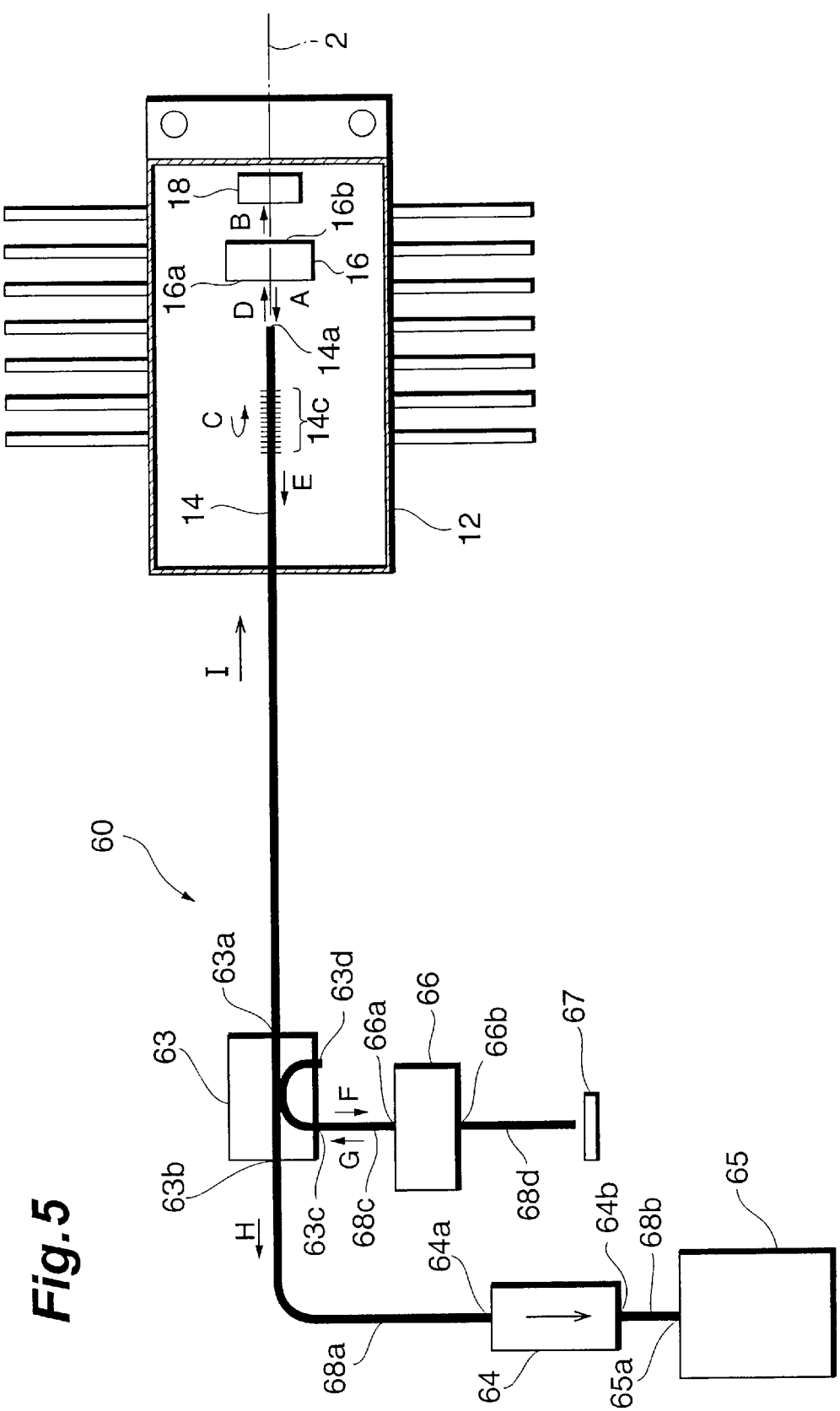

LIGHT EMITTING APPARATUS

BACKGROUND OF THE INVENTION

1. Field of the Invention

The present invention relates to a light emitting apparatus having a semiconductor optical amplifier and a grating fiber.

2. Related Background Art

A fiber grating semiconductor laser has a semiconductor optical amplifier and a grating fiber. The semiconductor optical amplifier possesses a front end surface for extraction of light and a rear end surface. This fiber grating semiconductor laser is also provided with an optical cavity consisting of a grating formed in the optical fiber and the rear end surface of the semiconductor optical amplifier. The lasers of this type are known as external cavity type semiconductor laser modules. The emission wavelength of such modules is determined by the Bragg wavelength of the fiber grating.

SUMMARY OF THE INVENTION

The inventor has conducted various studies on fabrication of semiconductor laser modules that can be applied in the field of optical communications particularly, in the field of WDM optical communication systems. From these studies the inventor found that the decrease of the bit error rate (BER) tended to be harder in the fiber grating semiconductor laser modules than in the DFB semiconductor lasers.

In the WDM optical communication systems, the bit error rate to be achieved should be equal to or less $10^{-10}$ and preferably $10^{-12}$. According to the studies by the inventor, it was, however, impossible to reach the above target even in measurement in the laboratory. According to the data presented in documents, the bit error rate becomes saturated around $10^{-10}$. A document describing it is, for example, Document (ECOC 97, Sep. 22–25, 1997, Conference Publication No. 448, "DENSE WDM TRANSMISSION IN STANDARD FIBRE USING DIRECTLY-MODULATED FIBRE GRATING LASERS AT 2.6 GBIT/S"). The above BER value was considered heretofore as a limit.

It is an object of the present invention to provide a light emitting apparatus that can offer characteristics over the bit error rate of the conventional limit.

In order to accomplish this object, the inventor has performed further studies. The inventor first made a comparison between the fiber grating semiconductor lasers and the DFB semiconductor lasers.

According to the comparison, the following points are common to the fiber grating semiconductor lasers and the DFB semiconductor lasers: (a) a semiconductor element is used as a light generating source; (b) they include the optical cavity consisting of the diffraction grating and one end surface of the semiconductor element. In the DFB semiconductor lasers, however, the feedback mechanism for optical amplification is provided by the grating formed in the semiconductor element. In the fiber grating semiconductor lasers, the optical cavity is composed of the rear end surface of the semiconductor element and the grating formed in the grating fiber on the other hand. In other words, the fiber grating semiconductor lasers have such a structural feature that the grating is provided outside the semiconductor element.

The inventor has done further studies on this structural difference. From the studies, the inventor realized that the cavity length of the fiber grating semiconductor lasers was longer than that of the DFB semiconductor lasers. This is a big difference from the DFB semiconductor lasers.

The semiconductor lasers with such longer cavity length demonstrate narrower oscillation spectral width. The inventor noted that the narrower spectral width meant weakness against disturbance from the outside. This means that, with the external disturbance on the fiber grating semiconductor lasers, the disturbance affects the oscillation wavelength thereof more than that on the DFB semiconductor lasers.

Then the inventor studied the disturbance on the fiber grating semiconductor lasers. Since the disturbance related to the phenomenon of bit error rate in very fast optical transmission, for example, the phenomenon of about 2.5 Gbit/sec, the environmental factor of temperature was excluded from the studies. The inventor noted electric disturbance and optical disturbance.

First, the inventor studied the electric disturbance. The DFB semiconductor lasers and the fiber grating semiconductor lasers both are installed in similar packages, e.g., in butterfly type packages. Although the fiber grating semiconductor lasers incorporate the semiconductor optical amplifier, the semiconductor optical amplifier has the structure very similar to that of the DFB semiconductor lasers. For this reason, the inventor considered that the impedance of power-supply wires and signal wires in the fiber grating semiconductor lasers should also be close to that in the DFB semiconductor lasers. Therefore, the inventor concluded that there existed no difference associated with the increase of bit error rate between these lasers in the process of converting electric current to light.

Next, the inventor studied the optical disturbance. Since the external disturbance is associated with very high frequencies, a light signal generated by itself can be a source of disturbance. Optical feedback or return light of the light signal is added through the grating fiber to the semiconductor optical amplifier. If this return light is the cause, it will not contradict with the structural factor that the fiber grating semiconductor lasers have the longer cavity length than the DFB semiconductor lasers.

It is, however, common practice to place an optical isolator on the path of the return light. Then the inventor carried out experiments for further detailed studies on the return light. From these experiments, the inventor has discovered that the return light degrades the bit error rate and that a required isolation value relates to the bit error rate to be achieved.

Under such circumstances, the inventor accomplished the present invention as follows.

A light emitting apparatus according to one aspect of the present invention comprises a light generating portion and an optical isolator. The light generating portion includes a semiconductor optical amplifier and a grating fiber. The semiconductor optical amplifier has a light emitting surface and a light reflecting surface. The grating fiber has an optical waveguide and a grating provided in the optical waveguide. The optical waveguide has a first end and a second end. The first end of the optical waveguide is optically coupled to the light emitting surface of the semiconductor optical amplifier. The optical isolator is provided between the light generating portion and an output of the light emitting apparatus. The isolation value of the optical isolator is not less than a value specified by the following:

$$-52.4-8.7 \times \log(\text{BER}),$$

where the isolation value is expressed in dB with respect to the bit error rate BER to be achieved at the transmission rate of 2.5 Gbps in the 1.55-$\mu$m band.

A light emitting apparatus according to another aspect of the present invention comprises a plurality of (n) light generating portions and an optical isolator. Here n is a natural number not less than 2. Each of the plurality of (n) light generating portions includes a semiconductor optical amplifier and a grating fiber. The semiconductor optical amplifier has a light emitting surface and a light reflecting surface. The grating fiber has an optical waveguide and a diffraction grating provided in the optical waveguide. The optical waveguide has a first end and a second end. The first end of each optical waveguide is optically coupled to the light emitting surface of the corresponding semiconductor optical amplifier. The optical isolator is provided between the plurality (n) of light generating portions and an output of the light emitting apparatus.

In this light emitting apparatus, a star coupler is provided between the plurality of (n) light generating portions and the optical isolator. The isolation of the optical isolator is not less than a value specified by the following:

$$-52.4-8.7 \times \log(\text{BER})-10 \times \log(n),$$

where the isolation is expressed in dB with respect to the bit error rate BER to be achieved at the transmission rate of 2.5 Gbps in the 1.55-μm band.

In this light emitting apparatus an AWG (Arrayed Wave Guide) is provided between the plurality of (n) light generating portions and the optical isolator. The isolation of the optical isolator is not less than a value specified by the following:

$$-52.4-8.7 \times \log(\text{BER})-2 \times \alpha,$$

where α=5 dB, and the isolation is expressed in dB with respect to the bit error rate BER to be achieved at the transmission rate of 2.5 Gbps in the 1.55-μm band.

BRIEF DESCRIPTION OF THE DRAWINGS

The above and other objects, features, and advantages of the present invention will become readily apparent from the following detailed description of the preferred embodiments of the present invention which will be given with reference to the accompanying drawings.

FIG. 3A and FIG. 3B are views showing the structure of the grating fiber.

FIG. 5 is a drawing to show an experiment system representing an optical configuration for measurement of bit error rates.

DESCRIPTION OF THE PREFERRED EMBODIMENTS

The embodiments of the present invention will be described with reference to the drawings. Identical or like portions will be denoted by the same reference symbols and redundant description will be omitted. In the present specification, the 1.55-μm band means the wavelength band in the range of not less than 1.53 μm and not more than 1.62 μm.

Figure 1:
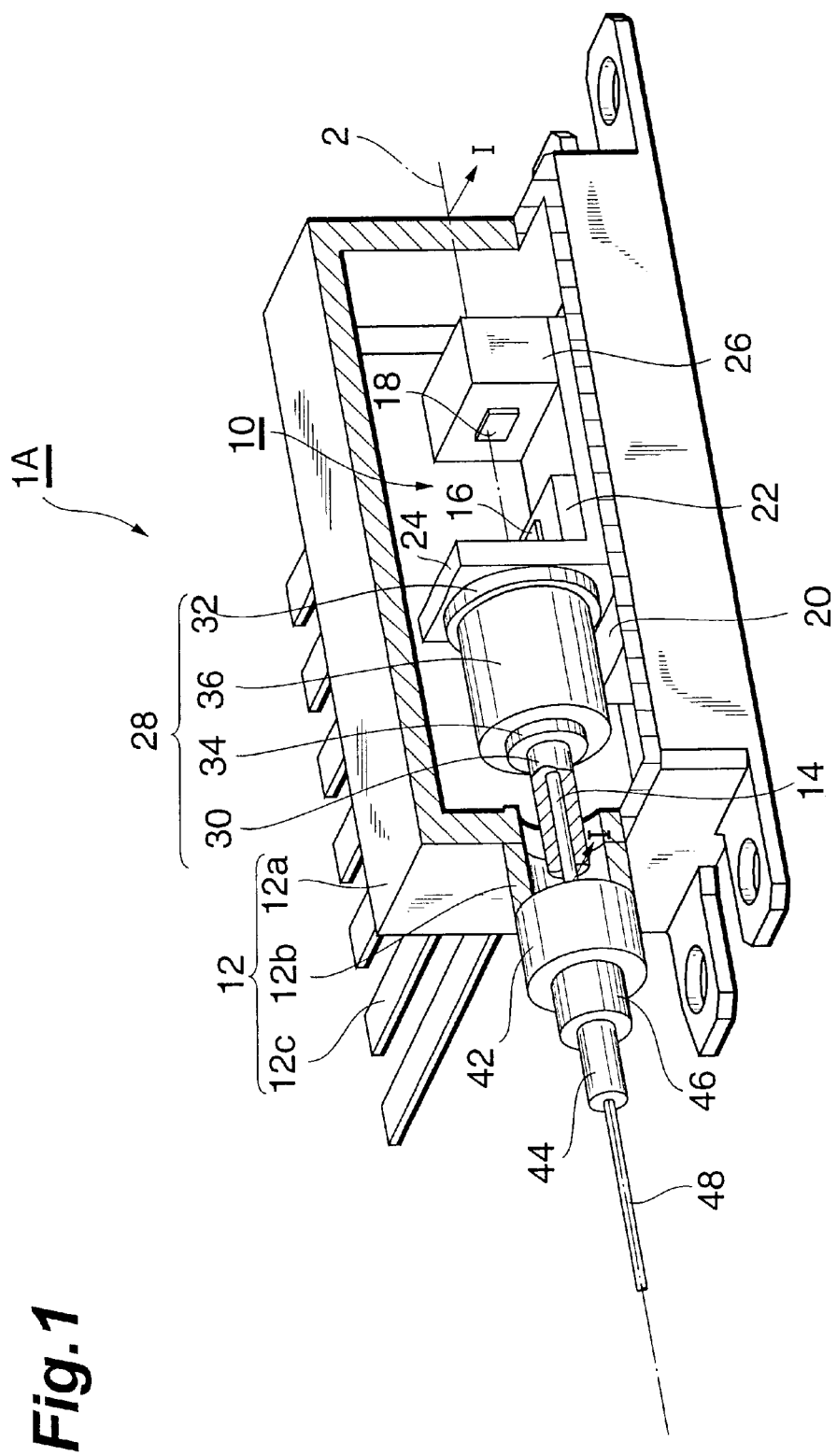
FIG. 1 is a view of the fiber grating laser according to the first embodiment.
Figure 2:
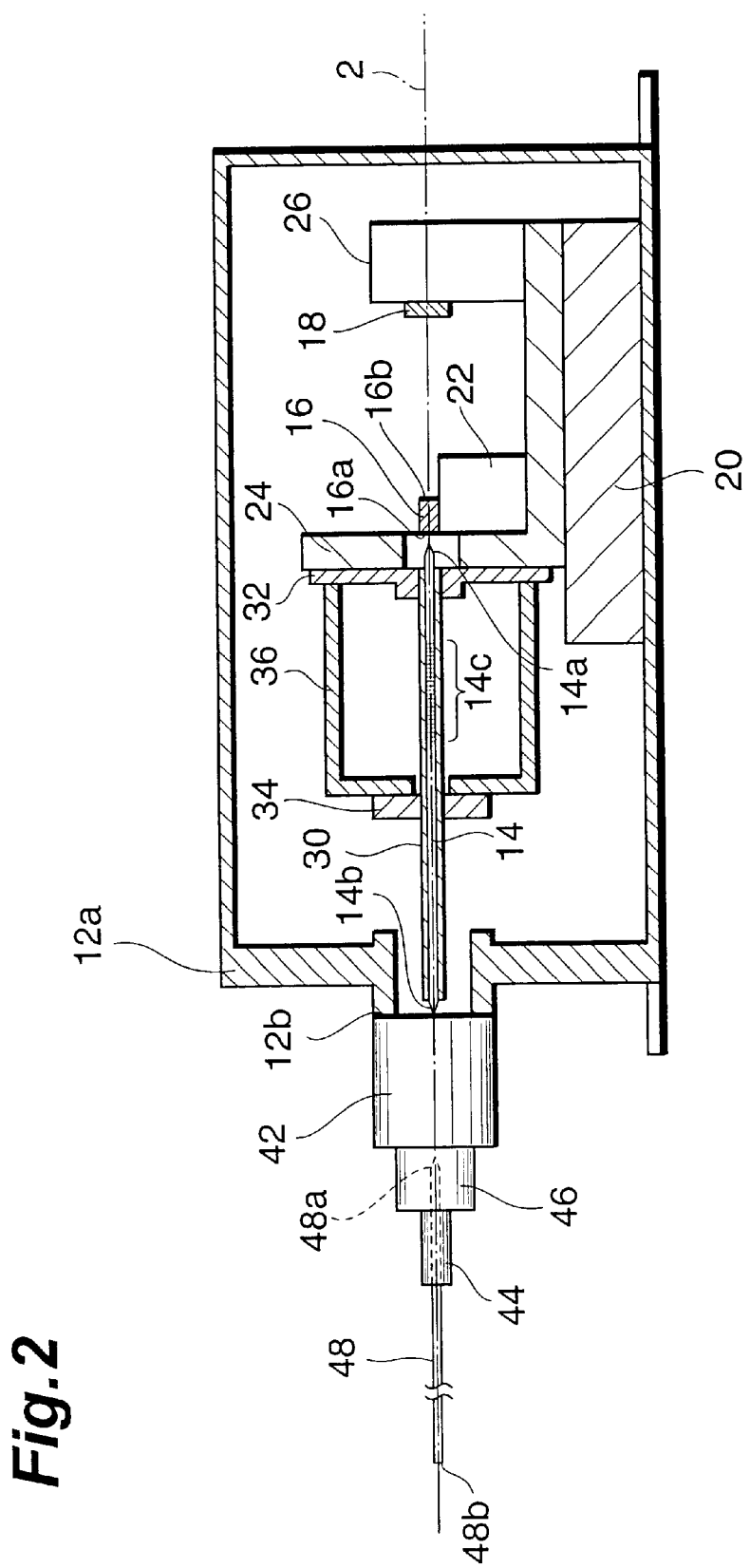
FIG. 2 is a view showing a vertical cross section taken along the line I—I of FIG. 1.

The light emitting apparatus of the first embodiment will be described. This light emitting apparatus is a fiber grating semiconductor laser module. FIG. 1 is a perspective view of this module. FIG. 2 is a cross-sectional view as a vertical cross section taken along the line I—I of FIG. 1, showing the main part of the laser module.

Referring to FIG. 1, the laser module 1 comprises a laser-module main part 10 and a housing 12. The housing 12 is a butterfly-type package in the embodiment illustrated in FIG. 1. The laser module main part 10 is disposed on the bottom of the package 12. The laser-module main part 10, together with an inert gas such as nitrogen gas, is encapsulated in the package 12. The housing 12 comprises a main body 12a accommodating the laser module main part 10 of the semiconductor laser, a tubular part 12b holding an optical fiber 48, and a plurality of lead pins 12c.

The laser-module main part 10 comprises a grating fiber 14, semiconductor optical elements 16, 18, mount members 22, 24, 26, and a positioning portion 28. The positioning portion 28 is composed of members 32, 34, and 36.

The semiconductor optical amplifier 16 is disposed on the mount member 22 and the semiconductor light receiving element 18 is disposed on the mount member 26. The mount member 22, 26 is disposed on the mount members 24. The mount member 24 is disposed on a thermoelectric cooler 20. The thermoelectric cooler 20 is commercially available, for example, as a temperature control element making use of the Peltier effect. The thermoelectric cooler 20 can control the temperature of the semiconductor optical amplifier 16, because the semiconductor optical amplifier 16 is mounted on the mount member 24. For this reason, the mount member 24 is preferably made of material exhibiting excellent thermal conductivity, such as aluminum nitride (AlN) used for chip carriers.

The semiconductor optical amplifier 16 has, for example, a plurality of semiconductor layers on an InP semiconductor substrate. The semiconductor layers include a first cladding layer including an n-type InP semiconductor film, a multiple quantum well active layer including InGaAsP semiconductor films, and a second cladding layer including a p-type InP semiconductor film. The multiple quantum well active layer includes laminated semiconductor films consisting of an InGaAsP semiconductor well film and an InGaAsP semiconductor barrier film. In these well film and barrier film, the bandgap width can be modified by changing their element compositions.

The light emitting surface 16a of the semiconductor optical amplifier 16 has the optical reflectivity of a sufficiently small value (for example, not more than 1% and preferably not more than 0.1%), while the light reflecting surface 16b has the optical reflectivity of a sufficiently large value (for example, not less than 90%). The optical reflectivity of the light emitting surface 16a is lower than that of the light reflecting surface 16b and as low as it substantially reflects no light. Since the optical reflectivity of the light emitting surface 16a is very small, the light reflecting surface 16b and a diffraction grating 14c of the grating fiber 14 compose an optical cavity. Laser light is generated by this optical cavity and the semiconductor optical amplifier 16. This laser light is taken out of an end 14b of the grating fiber 14.

Referring to FIG. 2, the optical fiber 14 is illustrated as an optical component. The optical fiber 14 has two ends 14a, 14b, and an optical waveguide between these ends 14a, 14b. This optical waveguide is provided with the diffraction grating 14c.

Referring to FIG. 3A and FIG. 3B, the optical fiber 14 has a core portion 14d and a cladding portion 14e. The core portion 14d contains germanium oxide and has a predetermined index of refraction. The cladding portion 14e is provided around this core portion 14d. The cladding portion 14e has an index of refraction smaller than that of the core portion 14d. Periodic index change is formed in a predetermined part of the core portion 14d by exposing the part to ultraviolet light. This part works as the grating 14c. The grating 14c has a reflection spectrum to reflect light in a predetermined wavelength band. This grating 14c, therefore, reflects light, entering from the ends 14a, 14b, in the predetermined wavelength band.

When the optical fiber 14 is disposed so as to be optically coupled to the semiconductor optical amplifier 16, the optical cavity is composed of the light reflecting surface 16b of the semiconductor optical amplifier 16 and the grating 14c of the grating fiber 14. This optical cavity specifies the longitudinal mode wavelength of laser oscillation.

Referring to FIGS. 1 and 2 again, the first end 14a of the optical fiber 14 has a lensed end and feces the semiconductor optical amplifier 16. Since the first end 14a has the lensed end, there is no need for placement of a lens between the semiconductor optical amplifier 16 and the optical fiber 14. For this reason, the cavity length can be shortened. The second end 14b of the optical fiber 14 has a polished end face and is faced to an optical isolator 42.

The tubular portion 12b of the package 12 has a through hole in communication with the space inside the main body 12a. The optical fiber 14 for guiding the light from the semiconductor optical amplifier 16 passes through this through hole. The optical isolator 42 is attached to the distal end of the barrel 12b.

The optical fiber 14 is positioned by the positioning portion 28 so that the first end 14a thereof is optically coupled to the semiconductor optical amplifier 16. The optical fiber 14 is also positioned so that the second end 14b is optically coupled to the optical isolator 42. Based on the arrangement as described above, the light generated in the semiconductor optical amplifier 16 is introduced to the optical isolator. The positioning portion 28 holds the optical fiber 14 so as to maintain the above-stated optical coupling.

The optical fiber 48 is introduced from the distal part of the tubular portion 12b of the package 12. The optical fiber 48 is covered at one end portion by ferrule 44. The optical isolator 42 holds a sleeve 46. When the ferrule 44 is inserted into the sleeve 46, the optical fiber 48 is optically positioned relative to the package 12. The first end 48a of the optical fiber 48 has a polished end face. The optical fiber 48 is positioned so that the first end 48a is opposed to the optical isolator 42, whereby the optical fiber 48 is optically coupled to the optical isolator 42. The output light is provided from the second end 48b of the optical fiber 48.

As a consequence, the semiconductor optical elements 16, 18, grating fiber 14, optical isolator 42, and optical fiber 48 are arranged on the axis 2. In this arrangement, the optical fiber 48 is optically coupled through the optical isolator 42 and grating fiber 14 to the semiconductor optical amplifier 16.

The optical isolator 42 is disposed between the optical fiber 14 and the optical fiber 48. The optical isolator 42 transmits the light from the optical fiber 14 but intercepts the light from the optical fiber 48 at a predetermined attenuation rate. This reduces the quantity of external disturbance light reaching the grating fiber 14.

Figure 4A:
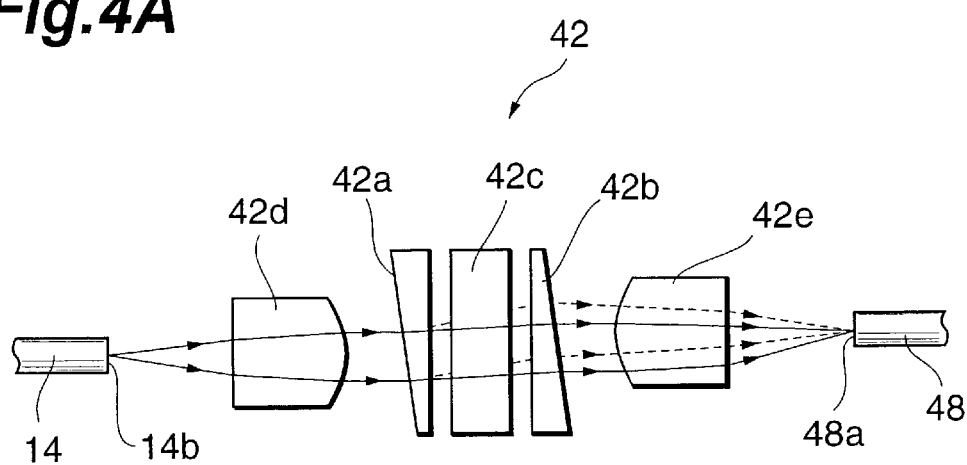
FIG. 4A and FIG. 4B are views showing the structure of the optical isolator.
Figure 4B:
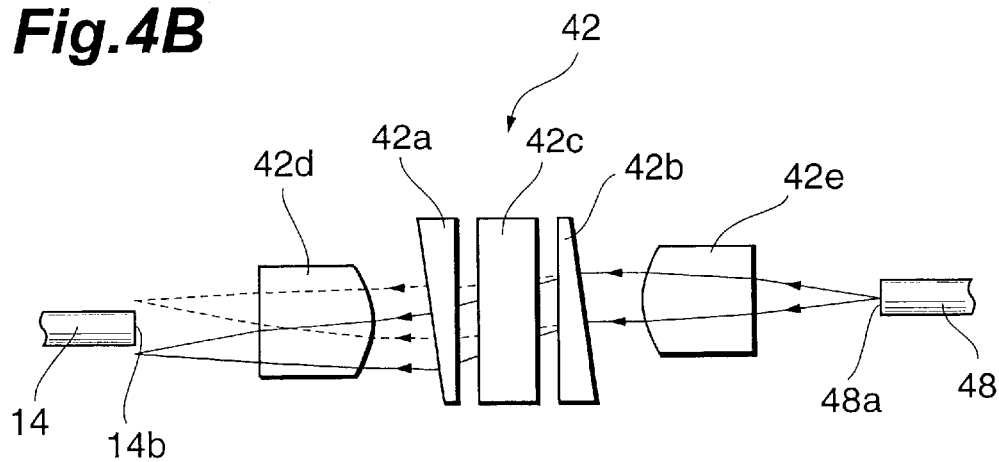

FIG. 4A and FIG. 4B are views showing an embodiment of the optical isolator, such as a fiber type optical isolator. The optical isolator 42 comprises a first birefringent device 42a, a second birefringent device 42b, and a Faraday rotator 42c which are aligned along a predetermined axis. The first and second birefringent devices 42a, 42b are birefringent optical elements containing a birefringent material, such as rutile, or wedge-shaped birefringent plates. The first birefringent device 42a is opposed to the second end 14b of the grating fiber 14, thereby being optically coupled to the second end 14b. The second birefringent device 42b is opposed to the first end 48a of the optical fiber 48, thereby being optically coupled to the first end 48a. The Faraday rotator 42c is disposed between the first and second birefringent devices 42a, 42b. The Faraday rotator 42c contains a Bi-YIG crystal, for example.

The optical isolator of this structure has, for example, the characteristics of the insertion loss of not more than 2 dB and the isolation of 40 dB for the light in the 1.55-$\mu$m band. In cases necessitating further isolation, it can be achieved by connecting a plurality of optical isolators in series.

Referring to FIG. 4A and FIG. 4B, optical paths of light traveling forward and backward in the optical isolator will be described.

The light traveling forward in the optical isolator propagates as follows. The light from the grating fiber 14 is converted into nearly parallel light by a lens 42d. This light is separated into ordinary rays (solid lines) and extraordinary rays (dashed lines) in the first birefringent device 42a. The ordinary rays and extraordinary rays both travel through the Faraday rotator 42c and the second birefringent device 42b. The transmitted light is converged through a lens 42e at the first end 48a of the optical fiber 48.

On the other hand, the light traveling backward in the optical isolator propagates as follows. The light from the optical fiber 48 is converted into nearly parallel light by the lens 42e. This light is separated into ordinary rays (solid lines) and extraordinary rays (dashed lines) in the second birefringent device 42b. The ordinary rays and extraordinary rays both travel through the Faraday rotator 42c and the first birefringent device 42a. The transmitted extraordinary rays are converged through the lens 42d at positions different from the second end 14b of the grating fiber 14.

In this manner the paths of the light traveling in one direction (the forward light) are different from those of the light traveling in the opposite direction thereto (the backward light) in the optical isolator 42. For this reason, the light traveling in one direction can pass through the optical isolator 42, but the light in the other direction cannot pass through the optical isolator 42.

Subsequently, the experiment for detailed studies on the return light to the light emitting apparatus will be described hereinafter. FIG. 5 is a view showing an optical coupling of the experiment system.

Referring to FIG. 5, the fiber grating semiconductor laser for the experiment is illustrated as a device to be tested. The grating fiber 14, semiconductor optical amplifier 16, and photodiode 18 are arranged in the housing 12. The grating fiber 14 is provided with the grating 14c. The semiconductor optical amplifier 16 is optically coupled to the first end 14a of this grating fiber 14. The photodiode 18 monitors the light emission of the semiconductor optical amplifier 16. The device to be tested can have, for example, the structure illustrated in FIG. 10.

The second end of the grating fiber 14 is optically coupled to a first port 63a of an optical coupler 63. A second port 63b is optically connected through an optical fiber 68a to an input 64a of an optical isolator 64. An output 64b of the optical isolator 64 is optically connected through an optical fiber 68b to a bit error rate (BER) measuring device 65. A third port 63c is optically connected through an optical fiber 68c to an input 66a of a variable attenuator 66, and an output 66b thereof is optically coupled through an optical fiber 68d to a total reflection mirror 67. The total reflection mirror 67 reflects almost all received 1.55 μm light. A fourth port 63d is processed so as not to bring about substantial optical reflection, and thus reflection thereby can be ignored. In this configuration, the optical isolator 64 enables the isolation of about 60 dB, for example.

In the experiment system, the optical coupling between the grating fiber 14 and the semiconductor optical amplifier 16 is estimated to be −2.8 dB. The reflectivity of the light emitting surface of the semiconductor optical amplifier 16 is estimated to be not more than 0.1% in the 1.55-μm band. The reflectivity of the light reflecting surface is estimated to be 80% in the 1.55-μm band.

From the experiment using this experiment system, the inventor found the relationship between isolation and bit error rate. Specifically, with change in the quantity of reflected return light, the bit error rates varied according to this feedback quantity.

In the experiment system of FIG. 5, the light generated in the semiconductor optical amplifier 16 is emitted from the light emitting surface 16a. Part of the emitted light A is reflected by the grating 14c to become reflected light C, and the rest is transmitted by the grating 14c to become transmitted light E. Monitor light B is provided from the light reflecting surface 16b of the semiconductor optical amplifier 16. The monitor light B is incident to the photodiode 18.

The transmitted light E is incident to the optical coupler 63. The optical coupler 63 splits the transmitted light E into light H and light F. The branch light F enters the variable attenuator 66. The variable attenuator 66 attenuates the input light F by a predetermined quantity. The attenuated light G from the variable attenuator 66 is reflected at the total reflection mirror 67 and thereafter is incident through the variable attenuator 66 into the optical coupler 63. The light G is attenuated by the predetermined quantity from the input light F. The output light G travels through the optical coupler 63 to become return light I fed back to the light emitting apparatus. On the other hand, the branch light H is incident through the optical isolator 64 into the bit error rate (BER) measuring device 65. The branch light H is light branched from the light having been generated in the light emitting apparatus receiving the return light I.

In this experiment system, the power of the return light I to the fiber grating semiconductor laser varies with change in the attenuation rate of the variable attenuator 66. Therefore, when the bit error rate is measured by the measuring device 65 with change in the attenuation rate of the variable attenuator 66, this measurement is equivalent to change of optical isolation.

The inventor performed further studies for analyzing the experiment results. From the studies, the return light to affect the bit error rate is the light I and the light D traveling back to the semiconductor optical amplifier 16. Here, let us define the following quantities.

$P_0$: quantity of light emitted from the fiber grating semiconductor laser;

$P_r$: quantity of light returning to the grating 14c of the grating fiber 14;

$P_c$: quantity of light returning up to the semiconductor optical amplifier 16

Units of these quantities are mW.

The relation between the quantity $P_r$ of the light, returning to the grating 14c, and the quantity $P_c$ of the light, returning to the semiconductor optical amplifier 16, is expressed as follows:

$$P_c = P_r \times \eta \times (1 - R_{FG}).$$

In this equation, η represents coupling efficiency between the semiconductor optical amplifier 16 and the grating fiber 14, and $(1-R_{FG})$ represents the transmissivity in the grating 14c. Since the inventor estimated that η=−2.8 dB and $R_{FG}$=70% in this experiment system, the following relation holds.

$$\eta \times (1 - R_{FG}) = -8 \text{ dB} \approx 1/6.3$$

Therefore, the following relation is obtained.

$$P_c \approx P_r/6.3$$

Figure 6:
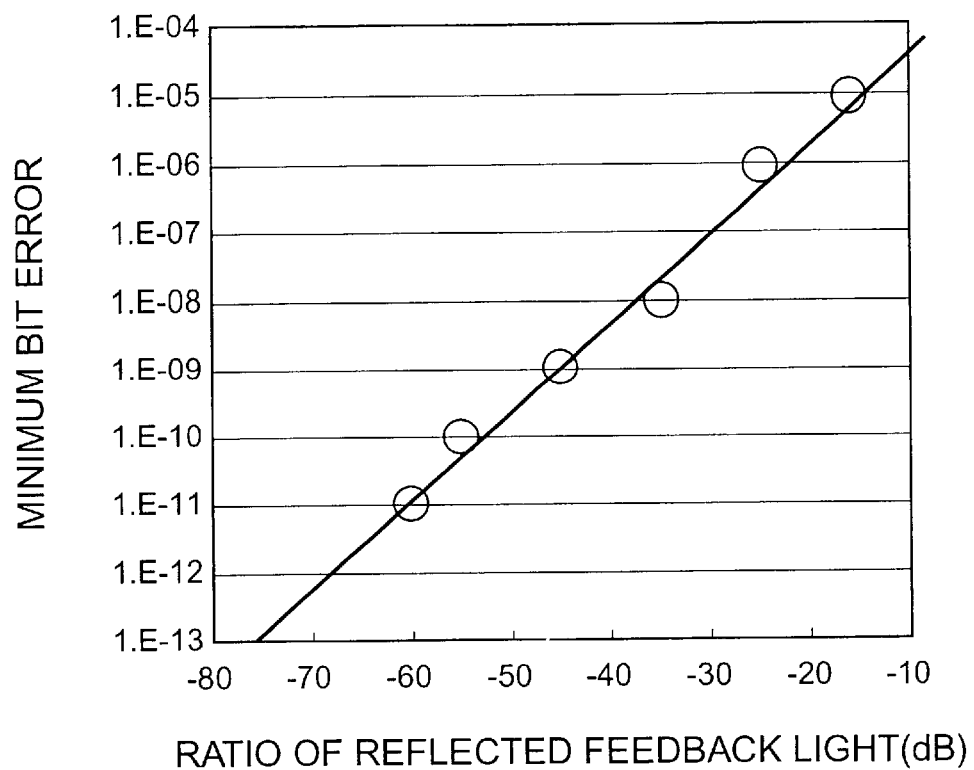
FIG. 6 is a drawing to show the relationship between return light and bit error rate.

FIG. 6 is a characteristic diagram showing the measurement results of bit error rates with change in the ratio of reflected feedback in this experiment system. The measurement was carried out under the conditions of the transmission rate of 2.5 Gbit/s and the measurement pattern of NR2, PRBS $10^{23}-1$. The axis of abscissa indicates $P_r/P_0$ in dB. FIG. 6 shows that the bit error rate decreases with decrease in the quantity of return light.

The bit error rate BER in FIG. 6 is defined by E(t)/N(t). E(t) represents the number of bits having been received as errors during the period of time t, and N(t) represents the number of all bits having been transmitted during the period of time t.

From the above experiment results, the inventor found the relations below in order to obtain the isolation of the optical isolator. The following relations are derived from the ratio between the quantity $P_r$ of light, returning to the grating 14c of the grating fiber 14, and the quantity $P_c$ of light, returning up to the semiconductor optical amplifier 16.

$$P_c/P_0 = \eta \times (1 - R_{FG}) \times P_r/P_0$$

$$\log(P_c/P_0) = \log(\eta \times (1 - R_{FG})) + \log(P_r/P_0)$$

Then the following relation is obtained by substituting, into the above relation, the some constants of the fiber grating laser used in this experiment.

$$\log(P_c/P_0) = -8 \text{ dB} + \log(P_r/P_0)$$

This relation permits us to read the axis of abscissa of FIG. 6, $10 \times \log(P_r/P_0)$, as the quantity $P_c$ of the light returning to the semiconductor optical amplifier 16. Thus, the inventor has obtained the relationship between the bit error rate (BER) and the quantity $P_c$ of the light returning to the semiconductor optical amplifier 16.

The inventor also estimated that the quantity of system feedback (i.e., maximum reflection quantity) in assumed systems was about $10 \times \log(P_r/P_0) = -25$ dB. Therefore, "required isolation" is difference between this quantity of system feedback and the quantity of return light corresponding to the bit error rate to be achieved. The value of this "required isolation" is determined by the optical isolator, η, and $R_{FG}$. Consequently, contribution from η and $R_{FG}$ has to be eliminated in order to determine the value of the optical isolator.

Figure 7:
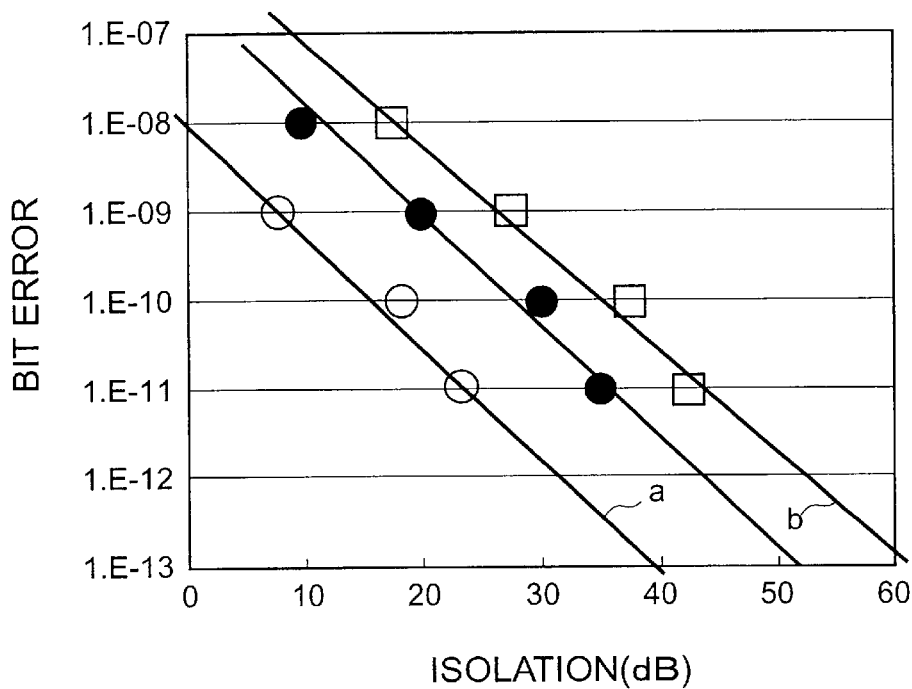
FIG. 7 is a drawing to show the relationship between isolation and bit error rate.

FIG. 7 is a characteristic diagram showing the relation between the isolation to be achieved by the optical isolator, and the bit error rate. By fitting the symbol "●" in FIG. 7 to a linear expression by use of the method of least squares, we obtain the following relation.

$$I=-58.6-8.7\times\log(BER)$$

Therefore, the isolation value is preferably chosen according to this relation in the range of the bit error rate of not more than $10^{-10}$ and not less than $10^{-12}$.

The inventor also discovered procedures of deriving generally applicable relations, which were not limited to the fiber grating semiconductor laser employed in the experiment.

In general, $\eta$ and $(1-R_{FG})$ appearing in $P_c/P_0=\eta\times(1-R_{FG})\times P_r/P_0$ can take various values. The inventor estimates that the constants of the fiber grating semiconductor lasers may vary in the following ranges.

$$-0.5 \text{ dB} \geq \eta \geq -10 \text{ dB}$$

$$1\% \leq R_{FG} \leq 90\%$$

Concerning the isolation, conditions are as follows.

Condition (a): $\eta=-10$ dB, $R_{FG}=90\%$

Condition (b): $\eta=-0.5$ dB, $R_{FG}=1\%$

Condition (a) shows a case in which the return light to the semiconductor optical amplifier is minimum, and Condition (b) shows a case in which the return light to the semiconductor optical amplifier is maximum. FIG. 7 shows the characteristic of Condition (a) by symbol "○" and the characteristic of Condition (b) by symbol "□." By also fitting each of these characteristics to a linear expression, we obtain the following relations.

Condition (a): $I=-63.4-7.9\times\log(BER)$

Condition (b): $I=-52.4-8.7\times\log(BER)$

In FIG. 7, desired bit error rates are attained in the upper area of the straight line represented by each linear equation.

The following can be understood from these equations. Since the fiber grating semiconductor laser of Condition (a) is inferior by about 7.5 dB in $\eta$ to the laser device used in the experiment, the isolation can be made smaller by the degree corresponding thereto. Since the fiber grating laser of Condition (b) is superior by about 12 dB in $\eta$ to the laser device used in the experiment, it requires the isolation greater by the degree corresponding thereto.

The description heretofore shows how to determine the isolation in the external cavity type light emitting apparatus, such as the fiber grating semiconductor lasers. By employing this method, those skilled in the art can carry out several estimations similar to the estimation disclosed herein, using values different from the predetermined values described herein. Further, the isolation value can be determined, for example, also taking even the temperature characteristics of the respective components into consideration, and the isolation value can also be gained with change of the transmission rate.

Figure 8:
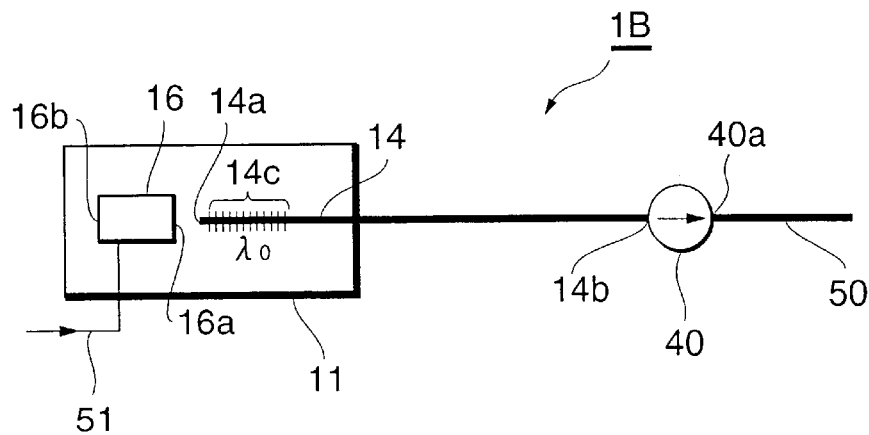
FIG. 8 is a schematic diagram of the light emitting apparatus according to the second embodiment.

FIG. 8 is a schematic diagram of the light emitting apparatus according to the second embodiment. With reference to FIG. 8, the fiber grating semiconductor laser 1B is illustrated.

The fiber grating semiconductor laser 1B is the same as the fiber grating semiconductor laser 1A illustrated in FIG. 1 and FIG. 2, except that the optical isolator 42 is replaced with the optical isolator 40. The optical isolator 40 can be attached to the housing 12 like the fiber grating semiconductor laser 1A, or can be arranged separately from the housing 11. That is, the optical isolator 40 is disposed between the grating fiber 14 and the optical waveguide 50.

The fiber grating semiconductor laser 1B includes the semiconductor optical amplifier 16, the grating fiber 14, and the optical isolator 40. The grating fiber 14 and semiconductor optical amplifier 16 are disposed in the housing 11. The semiconductor optical amplifier 16 is modulated by a signal 51 from the outside. A modulated signal (output light) is sent through the output 40a of the optical isolator 40 to the optical waveguide 50. On the other hand, the return light from the optical transmission line 50 is intercepted down to below the predetermined value by the optical isolator 40. As a consequence, the bit error rate of not more than about $10^{-10}$ is achieved even under practical circumstances.

Figure 9:
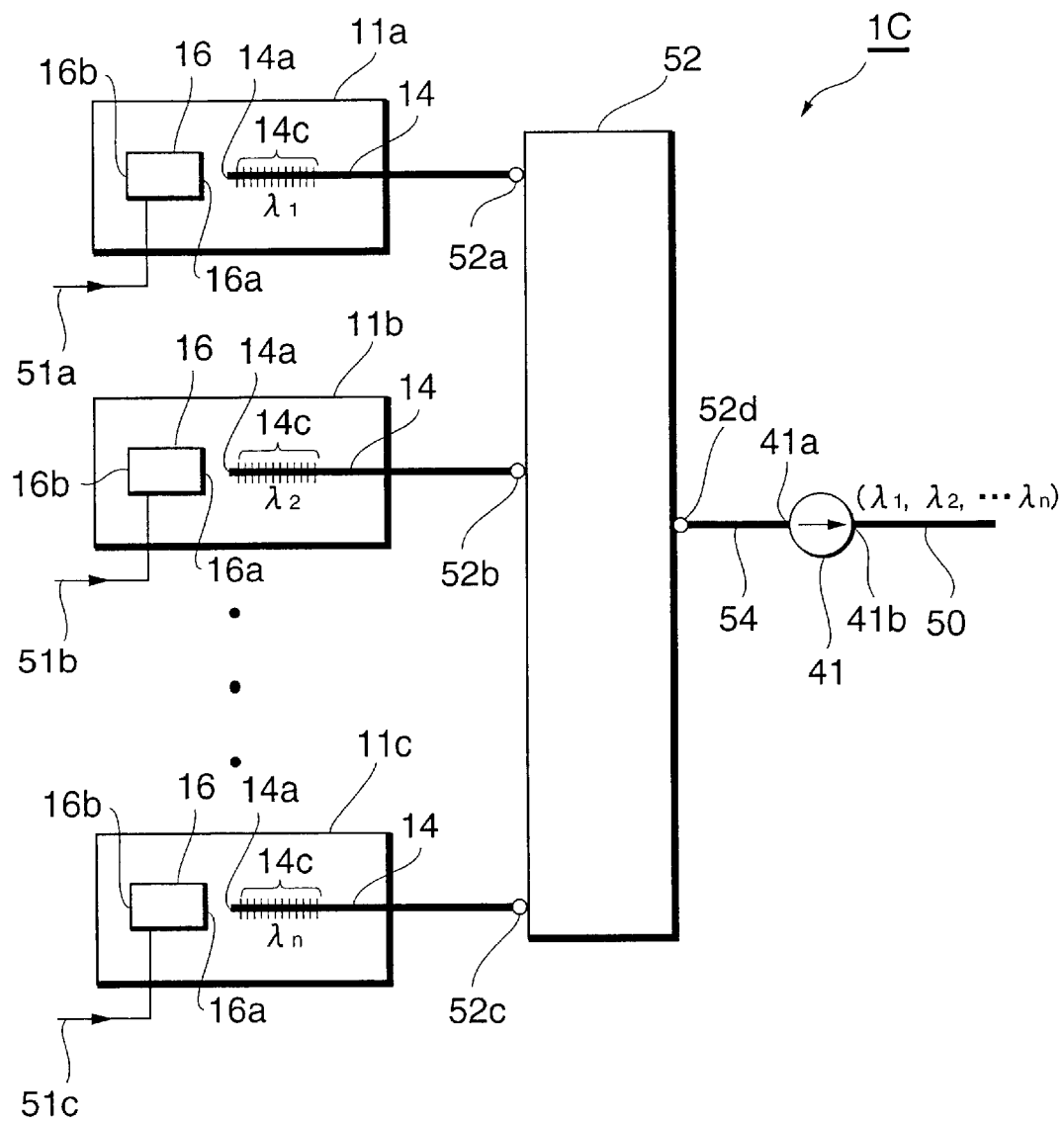
FIG. 9 is a schematic diagram of the light emitting apparatus according to the third embodiment.

FIG. 9 is a drawing showing the light emitting apparatus according to the third embodiment. Referring to FIG. 9, the light emitting apparatus 1C for WDM is illustrated. The light emitting apparatus 1C has a plurality of fiber grating semiconductor lasers 11a, 11b, 11c, an optical isolator 41, and an optical multiplexer means 52.

Figure 10:
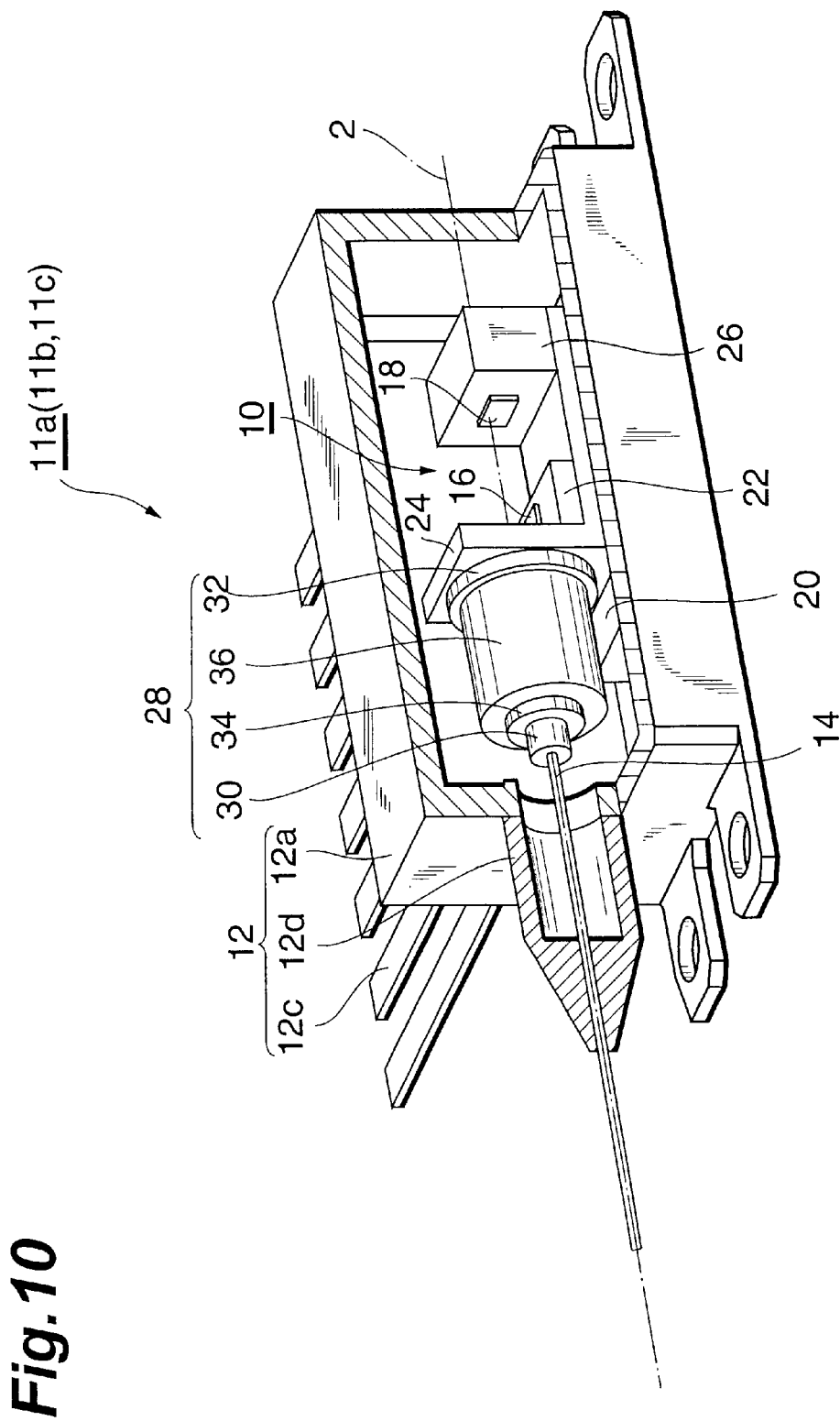
FIG. 10 is a drawing to show the fiber grating semiconductor laser applied to the third embodiment.

Each of the fiber grating semiconductor lasers 11a, 11b, 11c can be constructed in the configuration as illustrated in FIG. 10. The fiber grating semiconductor laser 11a generates light of the oscillation wavelength $\lambda_1$, the fiber grating semiconductor laser 11b generates light of the oscillation wavelength $\lambda_2$, and the fiber grating semiconductor laser 11c generates light of the oscillation wavelength $\lambda_n$. The oscillation wavelengths $\lambda_1, \lambda_2, \lambda_n$ are different from each other. Outputs of the fiber grating semiconductor lasers 11a, 11b, 11c are coupled to respective input ports 52a, 52b, 52c of the optical multiplexer 52. The optical multiplexer 52 multiplexes the light signals supplied to these respective input ports and provides a multiplexed light signal to a single output port 52d. The optical multiplexer means 52 is an optical multiplexer such as a star coupler or an AWG. The output port 52d of the optical multiplexer 52 is coupled through an optical waveguide 54 to an input 41a of the optical isolator 41. An output 41b of the optical isolator 41 is coupled to an optical waveguide 50, such as an optical fiber. The output light from the light emitting apparatus is, therefore, provided from the output 41b of the optical isolator 41 to the optical waveguide 50.

A WDM signal including the wavelength components ($\lambda_1, \lambda_2, \ldots, \lambda_n$) is supplied to the optical waveguide 50. Each of the semiconductor optical amplifiers 16 included in the fiber grating semiconductor lasers 11a, 11b, 11c is modulated according to a signal 51a, 51b, or 51c from the outside. The modulated signals are multiplexed by the optical multiplexer 52 and thereafter the multiplexed signal is sent through the single optical isolator 41 to the optical transmission line 50. On the other hand, the return light from the optical transmission line 50 is intercepted down to below the predetermined value by the optical isolator 41. Therefore, the return light to each of the semiconductor optical amplifiers 16 in the fiber grating semiconductor lasers 11a, 11b, 11c is controlled below the predetermined value. As a result, the bit error rate of not more than about $10^{-10}$ is achieved under practical circumstances.

The optical multiplexer 52 is disposed between the fiber grating semiconductor lasers 11a, 11b, 11c and the optical isolator 44. For this reason, the optical multiplexer 52 gives rise to optical loss. With the optical loss α, the optical power Pr (dBm) of light, which returns to the fiber grating semiconductor lasers through the optical isolator 41, is expressed by the following equation:

$$Pr=Pf-2\times\alpha-I,$$

where I is the optical isolation value of the optical isolator 41 and Pf (dBm) is the output power of the fiber grating semiconductor lasers. The bit error rate is achieved when (Pf−Pr) becomes not less than the optical isolation $I_0$ (dB) without optical loss. Here, the optical isolation value $I_0$ corresponds to the optical isolation value obtained in the first embodiment. This leads to the following:

$$Pf-Pr=2\times\alpha+I\geq I_0.$$

By substituting $I_0$ into this equation, the following is derived:

$$I\geq -52.4-8.7\times\log(BER)-2\times\alpha.$$

As apparent from this equation, the optical isolation condition is gentler than that in the case of α=0.

Since the return light through the optical isolator 41 passes in the opposite direction through the star coupler, the star coupler functions as a light splitting means. Therefore, the return light to each of the fiber grating semiconductor lasers 11a, 11b, 11c becomes weaker according to the number n of split branches by the light splitting means. Consequently, the isolation required of the optical isolator 41 thus changes according to the number n of branches. The inventor estimated the optical loss in the star coupler as follows:

$$\alpha=10\times\log(n).$$

In this case, the isolation of the optical isolator is not less than the value specified by the following equation in dB with respect to the bit error rate BER to be achieved at the transmission rate of 2.5 Gbps in the 1.55-μm band:

$$-52.4-8.7\times\log(BER)-10\times\log(n).$$

The inventor also estimated the optical loss to be 5 dB to 10 dB in the case of optical multiplexing with the AWG. At this case, when the severest value α=5 dB is applied, the isolation of the optical isolator is not less than the value specified by the following equation in dB with respect to the bit error rate BER to be achieved at the transmission rate of 2.5 Gbps in the 1.55-μm band:

$$-52.4-8.7\times\log(BER)-2\times\alpha$$
$$=-62.4-8.7\times\log(BER).$$

The principles of the invention have been described and illustrated in the preferred embodiments of the present invention, but it should be noted that the present invention can be changed or modified in arrangement and in details without departing from the principles described, as readily understood by those skilled in the art. For example, the present invention can also be applied to configurations different from the fiber grating semiconductor lasers described in the embodiments. In an example of such configurations, the light emitting surface of the semiconductor optical amplifier is coupled to the grating fiber and the output light is taken out of the light reflecting surface of the semiconductor optical amplifier. The optical reflectivity of the light reflecting surface of the semiconductor optical amplifier is set relatively small, that is, the optical reflectivity of the light reflecting surface of the semiconductor optical amplifier is set to a value approximately equal to that of the semiconductor laser. In this configuration, the optical isolator is disposed between an end of an optical fiber for optical output optically coupled to the light reflecting surface, and the light reflecting surface of the semiconductor optical amplifier. Therefore, the inventor claims all modifications and changes coming from the scope of the claims that follow and the scope of the spirit of the invention.

What is claimed is:

1. A light emitting apparatus for an optical communication system having a bit error rate (BER) that is less than a predetermined value, said light emitting apparatus comprising:

a light generating portion for generating an optical signal having said bit error rate (BER), said light generating portion including a semiconductor optical amplifier and a grating fiber, said semiconductor optical amplifier having a light emitting surface and a light reflecting surface, said grating fiber having an optical waveguide and a grating provided in said optical waveguide, said optical waveguide having a first end portion and a second end portion, said first end portion being optically coupled to said light emitting surface of said semiconductor optical amplifier; and an optical isolator provided between said light generating portion and an output port of the light emitting apparatus, and optically coupled to said second end portion of said grating fiber, said optical isolator having an isolation value not less than −52.4−8.7×log(BER) in dB at a transmission rate not more than 2.5 Gbps in a predetermined optical communication band to enable said light generating portion to generate said optical signal.

2. The light emitting apparatus according to claim 1, wherein said optical isolator is optically coupled to said second end portion of said grating fiber.

3. The light emitting apparatus according to claim 1, wherein said optical isolator comprises a first birefringent device optically coupled to said second end of said grating fiber, a second birefringent device optically coupled through an optical fiber to said output, and a Faraday rotator provided between the first and second birefringent devices.

4. The light emitting apparatus according to claim 1, further comprising a housing for accommodating said grating fiber and said semiconductor optical amplifier.

5. The light emitting apparatus according to claim 4, wherein said optical isolator is installed in said housing.

6. The light emitting apparatus according to claim 1, wherein the first end portion of said grating fiber has a lensed end.

7. A light emitting apparatus for an optical communication system having a bit error rate (BER) that is less than a predetermined value, said light emitting apparatus comprising:

a plurality, n, of light generating portions, each light generating portion for generating an optical signal, having said bit error rate (BER) a semiconductor optical amplifier having a light emitting surface and a light reflecting surface, and a grating fiber having an optical waveguide and a grating provided in said optical waveguide, said optical waveguide having a first end portion and a second end portion, said first end portion being optically coupled to said light emitting surface of said semiconductor optical amplifier;

an optical isolator provided between said light generating portion and an output port of the light emitting apparatus, and optically coupled to said second end portion of said grating fiber, said optical isolator having an isolation value not less than −52.4−8.7×log (BER) −10×log(n) in dB at a transmission rate not more than 2.5 Gbps in a predetermined optical communication band to enable said light generating portion to generate said optical signal; and a star coupler provided between said plurality, n, of light generating portions and said optical isolator.

8. The light emitting apparatus according to claim 7, wherein wavelengths of light generated in said plurality, n, of light generating portions are different from each other.

9. The light emitting apparatus according to claim 7, wherein said optical isolator comprises a first birefringent device optically coupled to said second end portions of said grating fibers, a second birefringent device optically coupled through an optical fiber to said output, and a Faraday rotator provided between the first and second birefringent devices.

10. The light emitting apparatus according to claim 7, wherein the first end portion of each of said grating fibers has a lensed end.

11. The light emitting apparatus according to claim 7, further comprising a plurality of housings for accommodating the respective n light generating portions.

12. A light emitting apparatus for an optical communication system having a bit error rate (BER) that is less than a predetermined value, said light emitting apparatus comprising:

a plurality, n, of light generating portions, each light generating portion for generating an optical signal, having said bit error rate (BER) said light generating portion including a semiconductor optical amplifier having a light emitting surface and a light reflecting surface, and a grating fiber having an optical waveguide and a grating provided in said optical waveguide, said optical waveguide having a first end portion and a second end portion, said first end portion being optically coupled to said light emitting surface of said semiconductor optical amplifier;

an optical isolator provided between said light generating portion and an output port of the light emitting apparatus, and said optical isolator having an isolation value not less than −0.4−8.7×log (BER)−2×α in dB at a transmission rate not more than 2.5 Gbps in a predetermined optical communication band to enable said light generating portion to generate said optical signal, where α=5 dB, and;

an AWG provided between said plurality, n, of light generating portions and said optical isolator.

13. The light emitting apparatus according to claim 12, wherein wavelengths of light generated in said plurality, n, of light generating portions are different from each other.

14. The light emitting apparatus according to claim 12, wherein said optical isolator comprises a first birefringent device optically coupled to said second ends of said grating fibers, a second birefringent device optically coupled through an optical fiber to said output, and a Faraday rotator provided between the first and second birefringent devices.

15. The light emitting apparatus according to claim 12, wherein the first end portion of each of said grating fibers has a lensed end.

16. The light emitting apparatus according to claim 12, further comprising a plurality of housings for accommodating the respective, n, light generating portions.

17. The light emitting apparatus according to claim 1, wherein said predetermined optical communication band is a 1.55-$\mu$m band.

18. The light emitting apparatus according to claim 7, wherein said predetermined optical communication band is a 1.55-$\mu$m band.

19. The light emitting apparatus according to claim 12, wherein said predetermined optical communication band is a 1.55-$\mu$m band.

20. An optical communication system comprising:

an optical communication line having a bit error rate (BER) that is less than a predetermined value; and a light emitting apparatus optically coupled to said optical communication line, said light emitting apparatus including:

a light generating section for generating an optical signal, having said bit error rate (BER) said light generating portion including a semiconductor optical amplifier having a light emitting surface and a light reflecting surface, and a grating fiber which has an optical waveguide having a first end optically coupled to said light emitting surface of said semiconductor optical amplifier, and a second end, and a diffraction grating provided in said optical waveguide, and an optical isolator provided between said light generating portion and an output port of the light emitting apparatus and optically coupled to said second end portion of said grating fiber, and said optical isolator having an isolation value not less than −52.4−8.7×log(BER) in dB at a transmission rate not more than 2.5 Gbps in a predetermined optical communication band to enable said light generating portion to generate said optical signal.

* * * * *